United States Patent [19]

Forouhi et al.

[11] Patent Number: 5,753,528
[45] Date of Patent: May 19, 1998

[54] METHOD OF FABRICATING METAL-TO-METAL ANTIFUSE WITH IMPROVED DIFFUSION BARRIER LAYER

[75] Inventors: Abdul R. Forouhi; Iton Wang, both of San Jose, Calif.

[73] Assignee: Actel Corporation, Sunnyvale, Calif.

[21] Appl. No.: 551,835

[22] Filed: Nov. 7, 1995

Related U.S. Application Data

[62] Division of Ser. No. 247,243, Jun. 10, 1993, Pat. No. 5,510,646, which is a continuation of Ser. No. 842,872, Feb. 26, 1992, abandoned.

[51] Int. Cl.$^6$ .................... H01L 21/70; H01L 27/00
[52] U.S. Cl. .................... 437/60; 437/192; 437/922
[58] Field of Search ................ 437/922, 60, 192

[56] References Cited

U.S. PATENT DOCUMENTS

| | | | |
|---|---|---|---|
| 4,651,409 | 3/1987 | Ellsworth et al. | 29/576 |
| 4,748,490 | 5/1988 | Hollingsworth | 357/51 |
| 4,796,075 | 1/1989 | Whitten | 357/51 |
| 4,822,753 | 4/1989 | Pintchovski et al. | 437/192 |
| 4,823,181 | 4/1989 | Mohsen et al. | 357/51 |
| 4,899,205 | 2/1990 | Hamdy et al. | 357/51 |
| 4,914,055 | 4/1990 | Gordon et al. | 437/192 |
| 4,943,538 | 7/1990 | Mohsen et al. | 437/52 |
| 5,070,384 | 12/1991 | McCollum et al. | 357/51 |
| 5,093,711 | 3/1992 | Hirakawa | 387/71 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,173,449 | 12/1992 | Lorenzen et al. | 437/192 |
| 5,194,759 | 3/1993 | El-Ayat et al. | 307/202.1 |
| 5,196,724 | 3/1993 | Gordon et al. | 257/530 |
| 5,233,206 | 8/1993 | Lee et al. | 257/50 |
| 5,233,217 | 8/1993 | Dixit et al. | 257/530 |

(List continued on next page.)

FOREIGN PATENT DOCUMENTS

| | | | |
|---|---|---|---|
| 0 414 361 | 2/1991 | European Pat. Off. | H01L 21/90 |
| 0 416 903 | 3/1991 | European Pat. Off. | H01L 21/3205 |
| 0 452 091 | 10/1991 | European Pat. Off. | H01L 23/525 |
| 0 455 414 | 11/1991 | European Pat. Off. | H01L 23/525 |
| 0 500 034 | 8/1992 | European Pat. Off. | H01L 23/525 |
| 0 501 120 | 9/1992 | European Pat. Off. | H01L 23/525 |
| 0 528 417 | 2/1993 | European Pat. Off. | G11C 17/16 |
| 0 539 197 | 4/1993 | European Pat. Off. | H01L 23/525 |
| 2 367 352 | 10/1977 | France | H01L 27/088 |
| 2 222 024 | 2/1990 | United Kingdom | H01L 21/82 |
| 87/00969 | 2/1987 | WIPO | H01L 23/52 |
| 87/02827 | 5/1987 | WIPO | H01L 27/24 |
| 92/13359 | 8/1992 | WIPO | H01L 21/285 |
| 92/20109 | 11/1992 | WIPO | H01L 45/00 |
| 93/03499 | 2/1993 | WIPO | H01L 23/525 |
| 93/04499 | 3/1993 | WIPO | H01L 21/70 |
| 93/05514 | 3/1993 | WIPO | G11C 17/16 |

OTHER PUBLICATIONS

Cohen et al., "A Flat-Aluminum Based Voltage-Programmable Link for Field-Programmable Devices", IEEE Transactions on Electron Devices, vol. 41, No. 5, May 1994, pp. 721–724.

Gordon et al., "Conducting Filament of the Programmed Metal Electrode Amorphous Silicon Antifuse", 1993 IEEE, IEDM 93-27, pp. 2.6.1–2.6.4.

Hu, C., "Interconnect Devices for Field programmable Gate Array", 1992 IEEE, IEDM 92-591, p. 24.1.1–24.1.4.

Primary Examiner—Jey Tsai
Attorney, Agent, or Firm—D'Alessandro & Ritchie

[57] ABSTRACT

A metal-to-metal antifuse comprises a lower electrode comprising a first metal layer in an integrated circuit, a first barrier layer formed from a layer of TiW:N disposed over the lower electrode, a layer of antifuse material formed from amorphous silicon over the first barrier layer, a second barrier layer formed from a layer of TiW:N disposed over the layer of antifuse material, said second barrier layer, and an upper electrode over the second barrier layer, the upper electrode comprising a second metal layer in the integrated circuit.

4 Claims, 2 Drawing Sheets

U.S. PATENT DOCUMENTS

| | | | |
|---|---|---|---|
| 5,241,496 | 8/1993 | Lowrey et al. | 365/96 |
| 5,242,851 | 9/1993 | Choi | 437/49 |
| 5,248,632 | 9/1993 | Tung et al. | 437/195 |
| 5,266,829 | 11/1993 | Hamdy et al. | 257/530 |
| 5,272,101 | 12/1993 | Forouhi et al. | 437/50 |
| 5,272,666 | 12/1993 | Tsang et al. | 365/96 |
| 5,284,788 | 2/1994 | Spratt et al. | 437/52 |
| 5,286,993 | 2/1994 | Lowrey et al. | 257/390 |
| 5,290,734 | 3/1994 | Boardman et al. | 437/195 |
| 5,293,133 | 3/1994 | Birkner et al. | 324/713 |
| 5,298,784 | 3/1994 | Gambino et al. | 257/529 |
| 5,300,456 | 4/1994 | Tigelaar et al. | 437/195 |
| 5,302,546 | 4/1994 | Gordon et al. | 437/170 |
| 5,304,508 | 4/1994 | Cohen | 437/170 |
| 5,308,795 | 5/1994 | Hawley et al. | 437/195 |
| 5,318,924 | 6/1994 | Lin et al. | 437/192 |
| 5,322,812 | 6/1994 | Dixit et al. | 437/60 |
| 5,327,024 | 7/1994 | Cox | 307/465 |
| 5,328,865 | 7/1994 | Boardman et al. | 437/60 |
| 5,329,153 | 7/1994 | Dixit | 257/530 |
| 5,332,929 | 7/1994 | Chiang | 307/296.3 |
| 5,353,246 | 10/1994 | Tsang et al. | 365/96 |
| 5,381,035 | 1/1995 | Chen et al. | 257/530 |
| 5,387,311 | 2/1995 | Hall et al. | 156/630 |
| 5,390,141 | 2/1995 | Cohen et al. | 365/96 |
| 5,391,513 | 2/1995 | Delgado et al. | 437/60 |
| 5,391,518 | 2/1995 | Bhushan | 437/190 |
| 5,395,797 | 3/1995 | Chen et al. | 437/195 |
| 5,403,778 | 4/1995 | Kwok et al. | 437/188 |
| 5,404,029 | 4/1995 | Husher et al. | 257/50 |
| 5,412,245 | 5/1995 | Favreau | 257/530 |
| 5,412,593 | 5/1995 | Magel et al. | 365/96 |
| 5,482,884 | 1/1996 | McCollum et al. | 437/60 |
| 5,485,031 | 1/1996 | Zhang et al. | 257/530 |

5,753,528

1

METHOD OF FABRICATING METAL-TO-METAL ANTIFUSE WITH IMPROVED DIFFUSION BARRIER LAYER

CROSS-REFERENCE TO RELATED APPLICATION

This is a divisional of patent application Ser. No. 08/247,243, filed Jun. 10, 1993, U.S. Pat. No. 5,510,646 which is a continuation of patent application Ser. No. 07/842,872, filed Feb. 26, 1992 now abandoned.

BACKGROUND OF THE INVENTION

1. Field Of The Invention

The present invention relates to user-programmable antifuse structures. More particularly, the present invention relates to a metal-to metal antifuse structure with improved immunity to electrode diffusion through a barrier layer interposed between the electrodes and the antifuse material. The present invention relates to processing methods, in general, and the selection of diffusion barrier materials, in particular, to ensure manufacturability of products containing metal/a-Si/metal antifuses.

2. The Prior Art

Antifuses employing amorphous silicon antifuse material are known in the prior art. Since such antifuses are often deployed between metal layers in an integrated circuit, they may employ materials such as aluminum as the antifuse electrodes. Traditionally, several methods have been employed to form barrier layers between the electrodes and the amorphous silicon antifuse material. A thin layer of deposited silicon dioxide has been used. If this layer is too thin, it will not be an effective barrier, and if it is too thick, it will appreciably raise the programming voltage of the antifuse. Control of the thickness of this layer is a difficult task. Alternatively, the lower electrode has been formed from TiW itself. However, this layer cannot be used as the bottom layer of the antifuse and as an interconnect layer. A silicon nitride layer has also been deposited over the TiW layer. If this layer is too thin, it will not be an effective barrier, and if it is too thick, it will appreciably raise the programming voltage of the antifuse.

While titanium-tungsten (TiW) has been used as diffusion barrier for fabrication of antifuses comprising an amorphous silicon antifuse material sandwiched between two metal layers, TiW is not an effective diffusion barrier; especially for use in process technologies which employ alloy temperatures of about 400° C. to 450° C. or higher, because aluminum diffuses through the barrier layer to the amorphous silicon and changes its conductive properties. In addition Ti or W atoms may also diffuse into the amorphous silicon antifuse layer, altering its conductive properties.

BRIEF DESCRIPTION OF THE INVENTION

According to the present invention, a metal-to-metal antifuse includes a diffusion barrier, comprising a layer of nitrided titanium tungsten (TiW:N), interposed between the metal layers and the amorphous silicon antifuse material. According to a presently preferred embodiment of the invention, the TiW:N layer may be formed in situ by reactive ion sputtering of TiW in the presence of nitrogen. Alternatively, the TiW layer may be first formed and then later exposed to an ambient of nitrogen under conditions which will form a nitrided layer at the surface of the TiW layer.

2

Figure 1A:
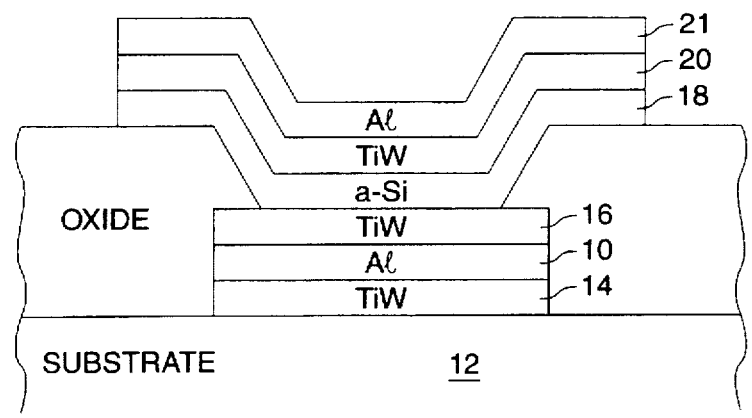
FIG. 1a is a diagram of a cross section of a prior art antifuse incorporating a TiW diffusion barrier layer.
Figure 1B:
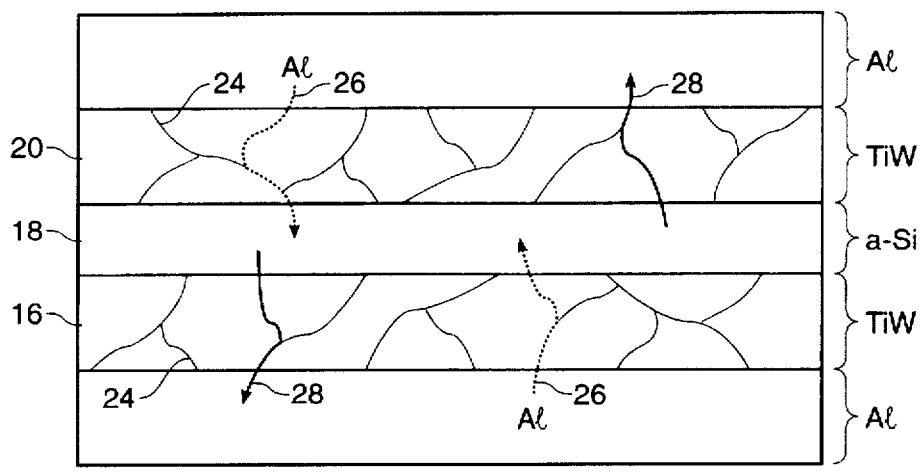

FIG. 1b is a schematic representation of a portion of the cross section of the prior art antifuse of FIG. 1a, showing the interdiffusion of silicon and aluminum through TiW grain boundaries.

Figure 2:
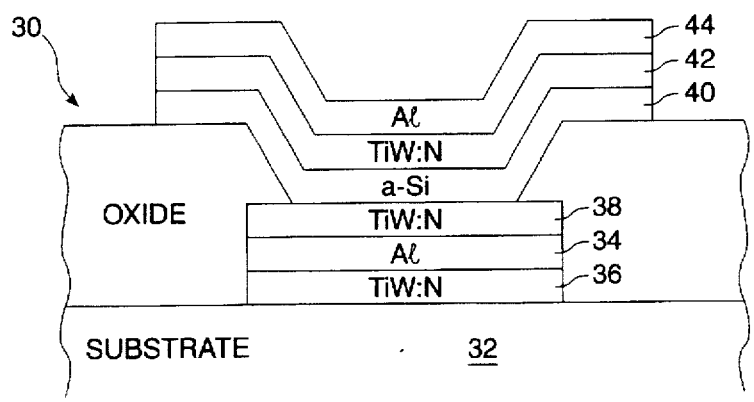

FIG. 2 is a diagram of a cross section of an antifuse fabricated according to the present invention employing a TiW:N diffusion barrier layer.

Figure 3A:
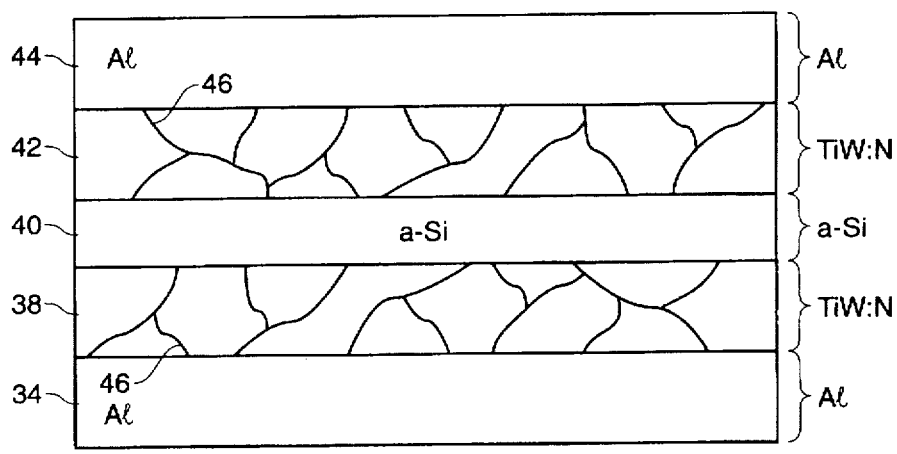
Figure 3B:
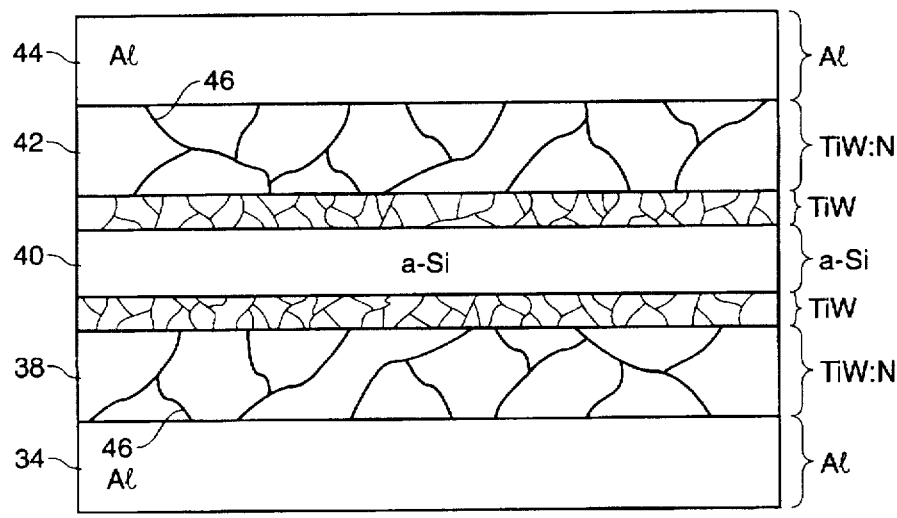

FIGS. 3a and 3b are schematic representations of two variations of cross sections of an antifuse according to the present invention incorporating a TiW:N diffusion barrier layer, showing that TiW:N is an effective diffusion barrier.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Metal-to-metal antifuses have been gaining in popularity for some time. Care must be taken to prevent the metal material from which the antifuse electrodes are fabricated from diffusing into the antifuse material in order to avoid reliability problems with antifuses which are to remain unprogrammed. This concern is especially acute when amorphous silicon is employed as the antifuse material.

FIG. 1a is a cross sectional view of a prior art metal-to-metal antifuse structure. The prior art metal-to-metal antifuse structure is shown comprising a lower electrode 10 formed from a metal layer in an integrated circuit disposed above and separated from the surface of a semiconductor substrate 12, which may include other structures, by a layer 14 which may be a barrier layer or an insulating layer. A lower TiW barrier layer 16 is interposed between lower electrode 10 and a layer of amorphous silicon antifuse material 18. An upper TiW barrier layer 20 is interposed between the antifuse material 18 and the upper electrode 22, formed from another metal layer in the integrated circuit.

The interdiffusion of Si and Al through TiW grain boundaries is a well-understood phenomenon and is presented schematically in FIG. 1b. The grain boundaries are represented by lines 24. The dotted arrows 26 represent the path of aluminum atoms to the amorphous silicon and the solid arrows 28 represent the path of silicon atoms to the aluminum through the TiW grain boundaries 24. Because of this diffusion characteristic, TiW is not an effective diffusion barrier for use in antifuse applications. In addition, Ti or W atoms may also diffuse into the amorphous silicon antifuse layer. This especially true in process technologies which employ alloy temperatures of about 400° C. to 450° C. or higher, because the high temperatures enhance aluminum diffusion through the barrier layer to the amorphous silicon.

According to the present invention, a metal-to-metal antifuse having an improved barrier layer to prevent metal diffusion into the antifuse material layer. Referring now to FIG. 2, a cross sectional view of a metal-to-metal antifuse fabricated according to the principles of the present invention is presented. The antifuse 30 of the present invention may be incorporated into an integrated circuit fabricated on a semiconductor substrate 32. Those of ordinary skill in the art will recognize that, for some applications, substrate 32 may be fabricated from a material other than a semiconductor material, such as a ceramic material or other insulator, or may be actually a layer formed over the base substrate material.

The lower electrode 34 of antifuse 30 preferably comprises a portion of a metal interconnect layer already employed in the integrated circuit, and may be formed from a metal such as aluminum or from other metals or combinations of metals and other materials commonly employed for integrated circuit interconnect layers and may typically have a thickness of about between 2,500 and 10,000 angstroms. Lower electrode 34 is shown disposed over an insulating layer 36, covering the substrate and any other intervening structures placed thereon (not shown). As in a conventional integrated circuit process, the layer comprising lower electrode 34 is formed on the top of insulating layer 36 and then appropriately patterned using conventional semiconductor processing techniques.

Next, a lower barrier layer 38 is formed over lower electrode 34. According to a presently preferred embodiment of the invention, lower barrier layer 38 comprises a layer of TiW:N having a thickness of about between 500 and 2,000 angstroms. According to the present invention, the TiW:N barrier films may be produced by a reactive sputtering process, in which $N_2$ gas is introduced into the noble gas ambient in the reaction chamber during the TiW deposition. With a $N_2$/Ar gas flow ratio of about 1/3, i.e., 50 sccm $N_2$ and 150 sccm Ar, a TiW:N film having a resistivity of about 240 $\mu\Omega$-cm can be produced. As the gas flow ratio is increased, the resistivity of the resulting TiW:N film increases and its diffusion barrier properties improve. Nevertheless, for circuit considerations, it may not be desirable to produce TiW:N films with resistivities exceeding about 400 $\mu\Omega$-cm.

Alternatively, an already-grown TiW film may be annealed in an atmosphere of pure $N_2$ or forming gas (90% $N_2$ and 10% $H_2$) at a temperature of about between 300° C. to 450° C. for a period of about 30 minutes. This process results in formation of TiW:N barrier films having barrier and electrical characteristics similar to those produced by in situ formation of TiW:N.

Next, an antifuse material layer 40, comprising amorphous silicon or other suitable material or materials formed using conventional processing techniques, is placed over the lower barrier layer 38. The thickness chosen for antifuse material layer 40 will depend on the parameters desired for the finished antifuse, such as programming voltage, final resistance, and capacitance in the unprogrammed state. Those of ordinary skill in the art will recognize that tradeoffs between these parameters will need to be evaluated to choose a thickness for this layer. Making such tradeoffs are well within the level of ordinary skill in the art.

After the formation of antifuse layer 40, an upper barrier layer 42 is formed on its surface. Upper barrier layer 42 may be formed from the same material and in the same manner as lower barrier layer 38.

Finally, an upper electrode 44 is formed over the surface of upper barrier layer 42. Upper electrode 42 of antifuse 30 preferably comprises a portion of another metal interconnect layer already employed in the integrated circuit, and may be formed from a metal such as aluminum or from other metals or combinations of metals and other materials commonly employed for integrated circuit interconnect layers and may typically have a thickness of about between 2,500 and 10,000 angstroms.

TiW:N barrier layers produced according to the teachings of present invention possess the advantageous properties of TiW (including good adhesion promotion, and low sheet resistance), and, at the same time is a more effective diffusion barrier to protect the antifuse layer from interdiffusion of Si and Al. The effectiveness of Tiw:N as a diffusion barrier is due to the presence of TiWN precipitates at Tiw:N grain boundaries, which block interdiffusion of Si and Al through grain boundaries. This is shown schematically in FIGS. 3a and 3b, where the dark lines 46 represent TiWN precipitates which act to plug the grain boundaries of the TiW:N film, thus effectively blocking interdiffusion of metal into the amorphous silicon antifuse layer.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for fabricating an antifuse between a first metal layer and a second metal layer in an integrated circuit, comprising the steps of:

forming said first metal layer;

forming a lower barrier layer over said first metal layer comprising the step of forming a layer of TiW:N;

forming a layer of antifuse material over said lower barrier layer;

forming an upper barrier layer over said antifuse material comprising the step of forming a layer of TiW:N; and forming said second metal layer over said upper barrier layer.

2. The method of claim 1 wherein the steps of forming said lower and upper barrier layers comprise a reactive TiW sputtering process in the presence of Ar and $N_2$ gas.

3. The method of claim 2 in which a $N_2$/Ar gas flow ratio of about 1/3 is employed.

4. The method of claim 1 wherein the steps of forming said lower and upper barrier layers comprise forming a TiW layer and annealing said TiW layer in the presence of $N_2$ gas.

* * * * *

UNITED STATES PATENT AND TRADEMARK OFFICE
CERTIFICATE OF CORRECTION

PATENT NO. : 5,753,528
DATED : May 19, 1998
INVENTOR(S) : Abdul Rahim Forouhi, Iton Wang It is certified that error appears in the above-identified patent and that said Letters Patent is hereby corrected as shown below:

---On Col. 1, line 15, replace "metal-to metal" with --metal-to-metal--.

---On Col. 1, line 41, replace "as diffusion" with --as a diffusion--.

---On Col. 2, line 49, replace "This especially" with --This is especially--.

---On Col. 3, line 46, replace "antifuse layer" with --antifuse material layer--.

---On Col. 3, line 51, replace "electrode 42" with --electrode 44--.

---On Col. 4, line 14, replace "Tiw:N" with --TiW:N--.

---On Col. 4, line 15, replace "TiWN" with --TiW:N--.

---On Col. 4, line 15, replace "Tiw:N" with --TiW:N--.

---On Col. 4, line 18, replace "TiWN" with --TiW:N--.

Signed and Sealed this

Twenty-ninth Day of December, 1998

Attest:

Attesting Officer

BRUCE LEHMAN
Commissioner of Patents and Trademarks